United States Patent [19]

Fullenkamp et al.

[11] 4,338,485

[45] Jul. 6, 1982

[54] HEADWALL UNIT FOR PATIENT SERVICING AND METHOD FOR INSTALLATION

[75] Inventors: Eugene H. Fullenkamp; Francis J. Burst, both of Batesville; Cecil R. Lohrey, Brookville; William D. Drew, Batesville, all of Ind.

[73] Assignee: Hill-Rom Company, Inc., Batesville, Ind.

[21] Appl. No.: 205,186

[22] Filed: Nov. 10, 1980

[51] Int. Cl.³ .......... H05K 5/00

[52] U.S. Cl. .......... 174/48; 220/4 R; 312/209; 312/223; 312/245; 361/334

[58] Field of Search .......... 174/48, 49; 312/209, 312/245, 223; 220/4 R; 361/334, 358, 390, 391, 429, 369, 370, 371, 356, 357

[56] References Cited

U.S. PATENT DOCUMENTS

| | | | |
|---|---|---|---|
| 3,267,332 | 8/1966 | Bobrick | 174/48 X |
| 3,353,068 | 11/1967 | Turk | 361/357 |
| 3,461,349 | 8/1969 | Meyer | 174/48 X |
| 3,462,892 | 8/1969 | Meyer | 174/49 X |
| 3,587,907 | 6/1971 | Okuda | 220/4 R |
| 3,762,398 | 10/1973 | Schefke et al. | 174/48 X |

*Primary Examiner*—B. A. Reynolds
*Assistant Examiner*—D. A. Tone
*Attorney, Agent, or Firm*—Burns, Doane, Swecker & Mathis

[57] ABSTRACT

A headwall unit for patient-care rooms has a skeletal framework which supports slidable cover panels. The cover panels are held in place by a removable vertically elongate portion of the framework. When the vertically elongate portion is released, the cover panels can be easily removed to provide access to the interior of the unit for installation or maintenance.

17 Claims, 8 Drawing Figures

HEADWALL UNIT FOR PATIENT SERVICING AND METHOD FOR INSTALLATION

BACKGROUND AND OBJECTS OF THE INVENTION

The present invention relates to headwall units of the type used in patient-care rooms.

Patient-care rooms, such as located in hospitals, nursing homes, etc., require that certain facilities be continuously available for patient servicing, such as a supply of gaseous nitrogen and oxygen, electrical outlets, room lighting, and a nurse-call intercom for example. It is customary to centralize such facilities at a so-called headwall unit or flatwall unit which mounts against a headwall of the room, as exemplified by the disclosures of the following U.S. Pat. Nos. Des. 234,761; Des. 253,246; 3,567,842; and 4,104,710. Such a headwall unit would be located adjacent the patient's bed and may include oxygen and nitrogen gas outlets, electrical outlets, room lights, nurse-call and intercom, all oriented for convenient access by patient and/or nurse.

Generally, headwall units comprise a skeletal framework formed of light-weight aluminum extrusion members. The framework can be mounted within a recess in the wall, or seated upon the floor, or suspended from the wall or ceiling. The various gas and electrical conduits are arranged within the inner space of the unit, such space being covered by decorative panels which mount to the front and possibly the side of the unit. Some of the panels provide access to the support, e.g., by containing electrical and gas outlets, intercom controls, light fixtures and switches, etc. It is desirable that the unit be ornamentally attractive, slim in profile, and that the interior space of the unit be readily accessible for maintenance and inspection.

As regards the latter expedient, it has, in some instances, been necessary to remove fasteners such as screws from the front of each panel in order to remove the panel. This is a time-consuming effort as numerous screws can be involved. Also, screws which are repeatedly inserted and removed can become worn and unsightly and thus adversely affect the appearance of the unit if visible from the front. Efforts to provide snap-in capabilities for the panel may involve difficulty in properly maneuvering the panels and eventually result in misalignment or skewing of the panels as the snap-in fixtures become deformed or worn.

In other instances, it may be necessary to remove two side panels as well as other parts of the unit in order to achieve access to the screws which retain the front panels. This involves considerable time and effort in disassembling and reassembling the unit. Moreover, if such screws are inserted laterally into holes in the peripheral edges of the panels, it may be necessary for an operator to physically hold a panel in place while trying simultaneously to align the screws and holes and install the screws.

As regards the initial installation of the headwall unit it often occurs in practice that the headwall unit is not available at the installation site at the most convenient opportunity for its installation, such as when the wall of the room is being constructed or refurbished. Such a time is most opportune for the installation of electrical and/or gas conduits which are to be eventually connected to the headwall unit. As a result, the overall efficiency, from a cost and labor standpoint, is diminished.

It is, therefore, an object of the present invention to minimize or obviate problems of the sort described above.

An additional object of the invention is to provide a novel and beneficial headwall unit.

Another object of the invention is to provide a headwall unit into which access may be easily gained.

A further object of the invention is to provide a headwall unit having front and side panels which may be easily and rapidly removed when access to the inside of the wall unit is needed.

Another object of the invention is to provide a method for installing and hooking up a headwall unit to increase the cost and labor efficiencies.

BRIEF SUMMARY OF THE INVENTION

These objects are achieved by a headwall unit of the type adapted for connection to a wall of a patient's room to provide services to the patient. The headwall unit comprises a skeletal framework to which patient service components are connected. The framework has front and side portions and includes pairs of vertically spaced horizontal track slots disposed along the front portion. The slots of each pair are open toward one another. Front cover panels are disposed in the pairs of track slots for horizontal sliding movement therein. The framework includes a vertically elongate, releasably attachable member at one side of the unit for preventing removal of the panels from the framework when attached and for accommodating horizontal sliding movement of said panels from the framework when released.

THE DRAWING

The objects and advantages of the invention will become apparent from the following detailed description of a preferred embodiment thereof in connection with the accompanying drawings in which like numerals designate like elements, and in which.

DETAILED DESCRIPTION OF A PREFERRED EMBODIMENT OF THE INVENTION

Figure 1:
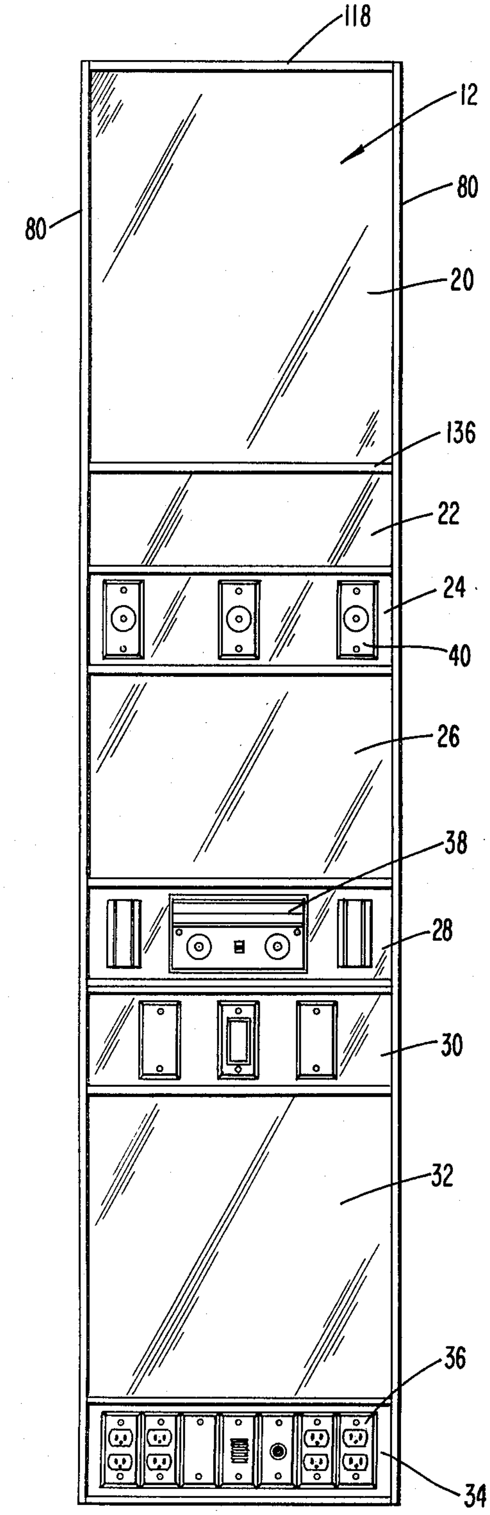
FIG. 1 is a front view of a fully assembled and installed headwall unit.

A headwall unit 10 according to the present invention is to be suspended from a vertical wall W of a patient's room. The unit includes a framework 11 which includes a front portion 12 and two side portions 14, the latter projecting outwardly from the wall. These front and side portions 12, 14 border an inner utility space 16, the latter being delimited by the wall W of the room.

Mountable on the framework 11 are a plurality of vertically spaced front panels 20, 22, 24, 26, 28, 30, 32 and 34 which cover the utility space 16. Some of the panels 20, 22, 26, 32 are merely decorative in nature, while other panels 24, 28, 30 and 34 are both decorative and functional in that they carry various patient-servicing components such as electrical receptacles 36, a nurse-call intercom 38, and gas outlets 40 for oxygen, compressed air and nitrogen, for example.

It will be appreciated that the quantity, size, and arrangement of the panels will vary, depending upon the types of services to be provided. The present description is merely exemplary of one typical unit.

Figure 3:
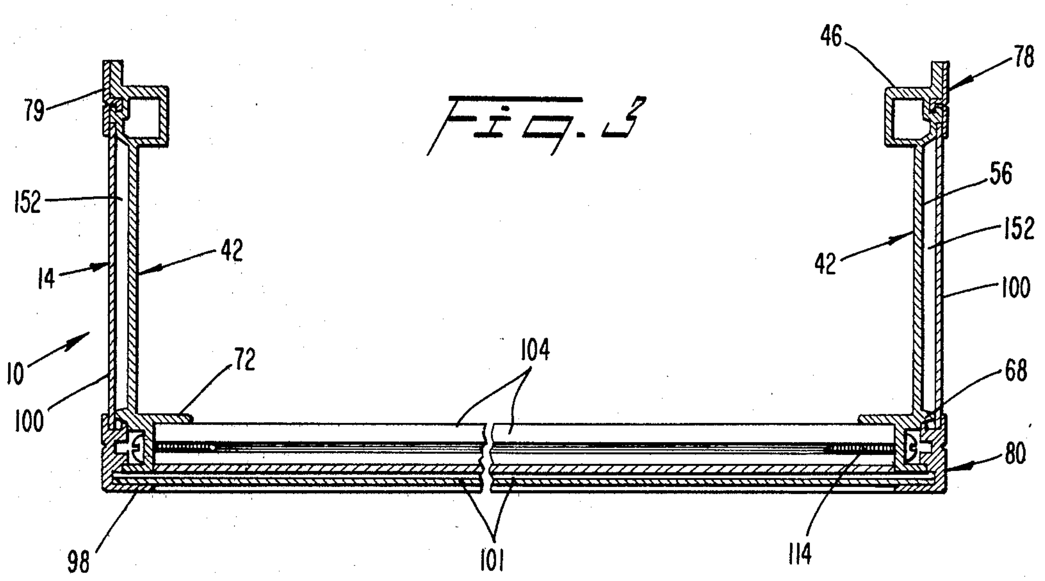
FIG. 3 is a horizontal cross-section through the framework of the headwall unit, with the front and side panels in place.
Figure 4:
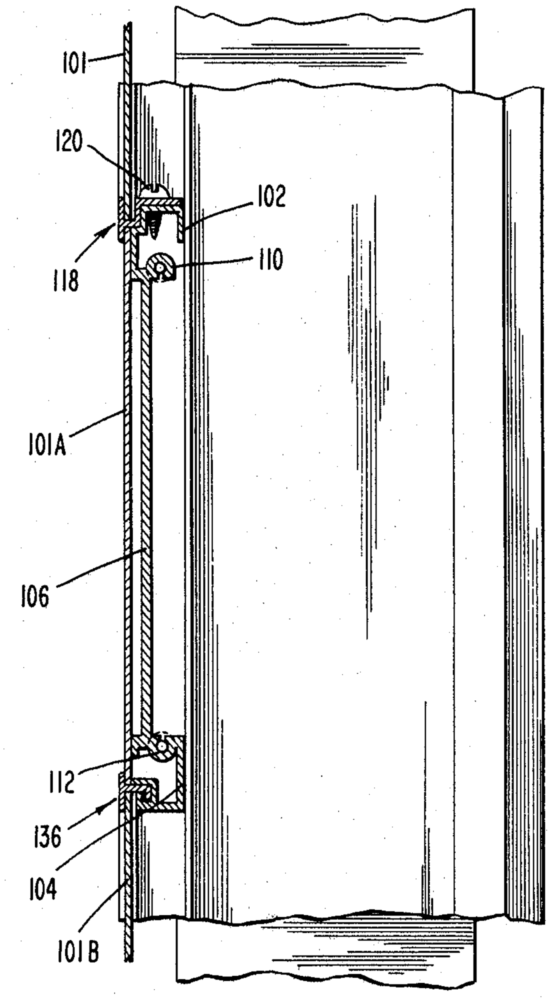
FIG. 4 is a vertical section through a front element of the framework with the front panels in place.
Figure 5:
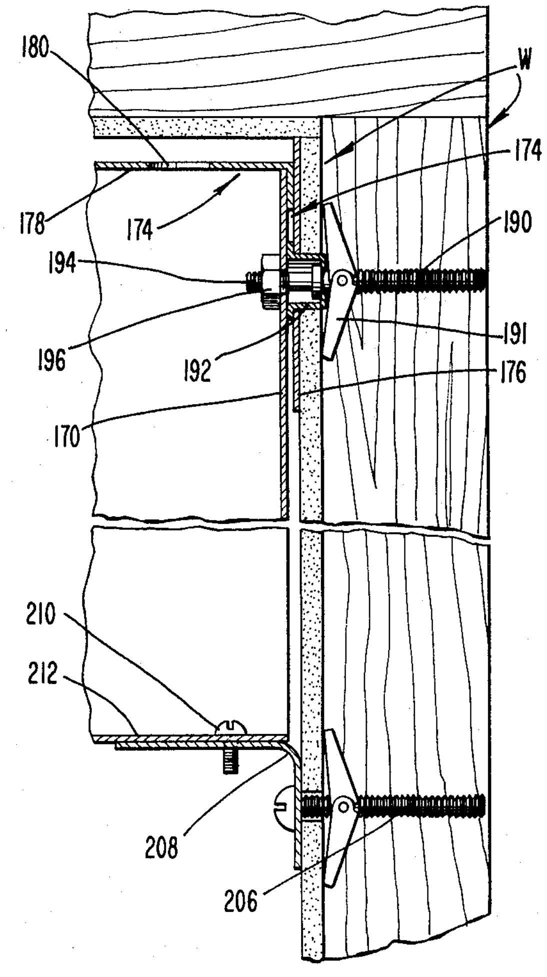
FIG. 5 is a vertical section through an upper portion of an installed headwall unit, depicting the manner of suspending the unit from a wall of the room.
Figure 6:
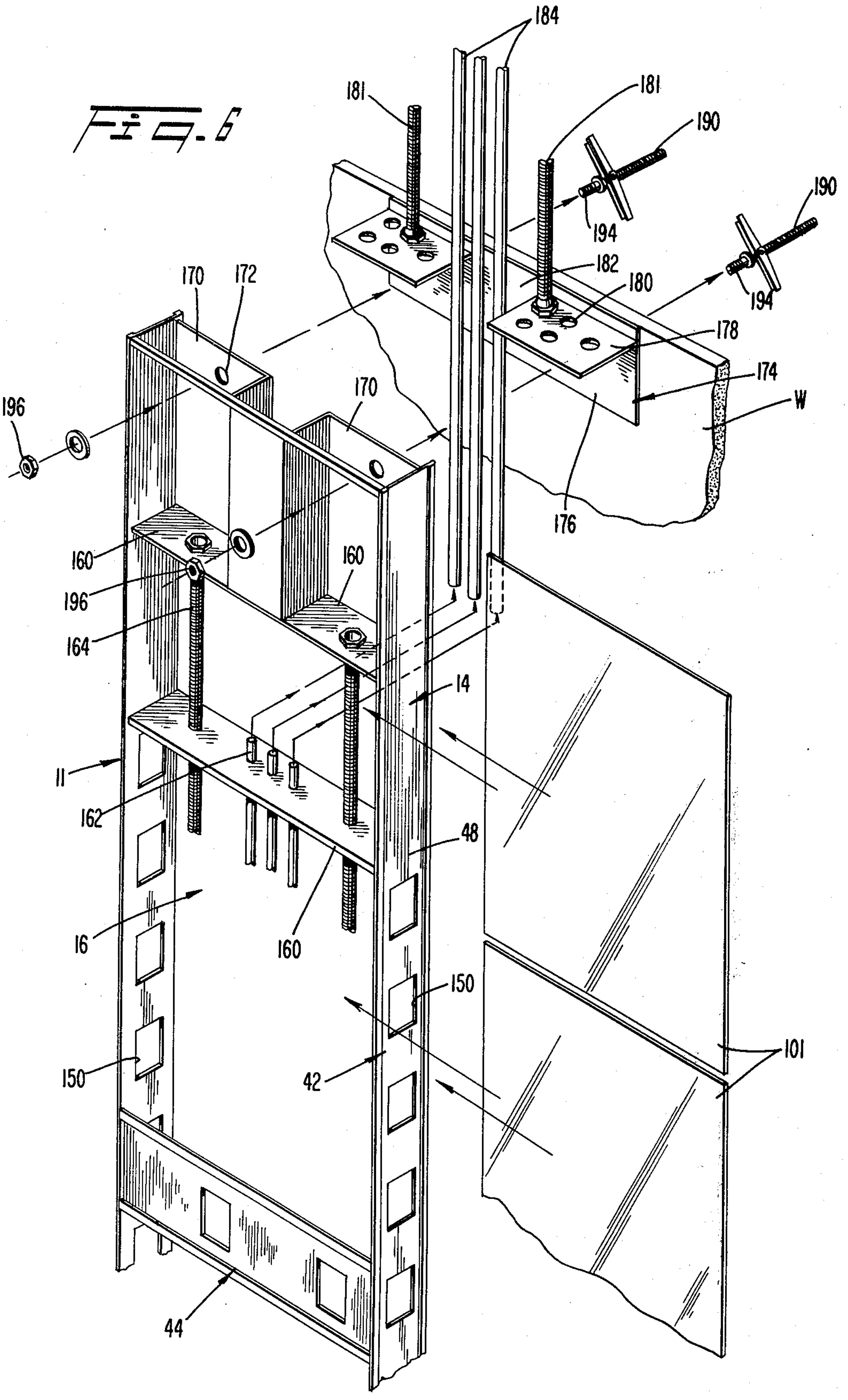
FIG. 6 is a perspective view of the framework of the headwall unit with the track members removed, and showing the manner of suspending the unit and the direction of inserting the front panels.

The framework 11 comprises a plurality of metal elements, preferably in the form of aluminum extrusions, which are joined together. In this regard, attention is directed to FIGS. 3, 5 and 6, in which it can be seen that the framework 11 basically includes a pair of vertically elongate side elements 42 which are interconnected by a plurality of vertically spaced front elements 44. Each side element 42 comprises a rear tubular portion 46 (FIG. 7), a thin web portion 48, and a front rail portion 50, all integrally formed of one piece. The side element is arranged such that in the installed condition of the wall unit, the tubular portion 46 is disposed to the rear, i.e., near or against the wall W, and the web portion 48 projects forwardly perpendicularly relative to the wall.

The tubular portion includes an outer surface 52 having an irregular configuration which forms a step face 54 that is parallel to and spaced laterally outwardly of an outer face 56 of the web portion 48. A shoulder surface 58 projects perpendicularly from the step face 54 at a rear end thereof. An end face 60 of the outer surface 52 is disposed parallel to the step face 54 and includes an L-shaped slot 62.

An outer surface of the rail portion 50 includes rear and front abutment faces 64, 65 disposed parallel to the web outer surface 56, with the front abutment face 65 situated somewhat outwardly relative to the rear abutment face. A recessed face 66 is spaced inwardly from the abutment faces. A rib 68 is disposed rearwardly of the abutment faces and projects outwardly therebeyond. A tip face 70 of the rib is aligned with the step face 54 of the tubular portion 46. A stop wall 72 extends inwardly from a base section 74 of the rail portion and is set-back rearwardly from a front leg 76 of the rail portion.

Connected to the tubular and rail portions 46, 50 are rear and front track members 78, 80, respectively. The rear track member 78 includes a flange 79 and an L-shaped slot 62 of the tubular portion 46 and is secured therein in any suitable manner. The flange 79 of the rear track member 78 lies flush against the end face 60 of the tubular portion 46 and projects slighly forwardly thereof to form, together with the step face 54, a track slot.

The front track member 80 is releasably secured to the rail portion 50 by means of releasable fasteners such as flathead, countersunk screws 86. At its rear side, the front track member 80 includes a pair of rearwardly projecting arms 87, 89, the innermost one 89 of which includes a surface 88 which bears against the rear abutment surface 64. At its front side the front track member 80 includes a gate formed by a first face 90 disposed parallel to and bearing against the front abutment face 65, and a second face 92 disposed parallel to the front leg 76 of the rail portion 50 and bearing thereagainst.

The front rail portion 50 also includes a leading flange 98 which is spaced forwardly of the front leg 76 to define therewith a track slot. The track slots of the rail portions 50 on opposite sides of the unit 10 are open toward each other and are adapted to receive the decorative panels 20–34.

The outer arm 87 of the front track member 80 is arranged to be spaced outwardly of the tip face 70 of the rib 68 to define a track slot therebetween which is aligned with the track slot formed by the flange 79 and the step face 54. The track slots are adapted to receive opposite edges of a vertically elongate decorative panel 100 to retain same in spaced relationship with the outer surface 56 of the web portion 48.

Figure 7:
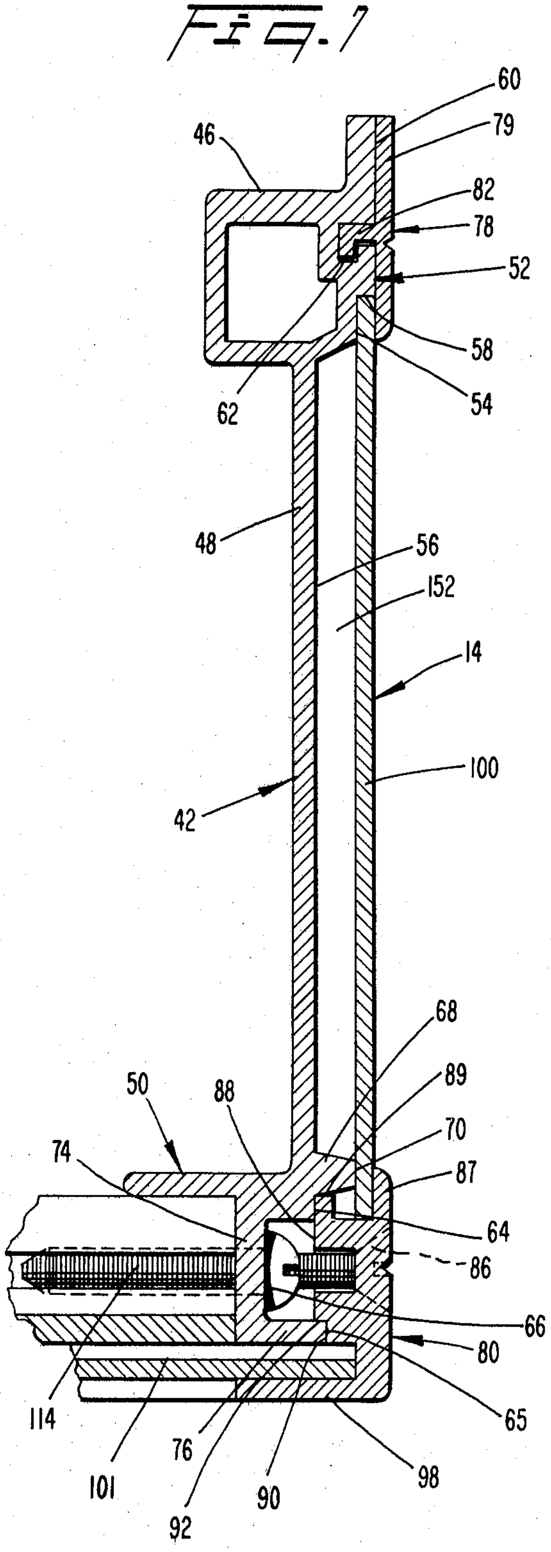
FIG. 7 is a horizontal section through a side frame element.

The front element 44 (FIG. 8) comprises upper and lower head portions 102, 104 interconnected by an integrally formed web 106. When installed, the front element 44 extends between the rail portions 50 of the side elements and bears against the stop walls 72 of the latter (FIG. 7). Upper and lower channels 110, 112 are formed in the web portion 106 of the front element for receiving screw-type fasteners 114 (FIG. 7) which extend through the front rails 50, perpendicularly to the plane of same, to secure the front element 44 to the side elements 42.

The upper head portion 102 contains a horizontal step 116 onto which is mounted an upper track member 118, the latter being secured by screw-type fasteners 120. The upper track member 118 includes a vertical flange 119, an upper section 122 of which is spaced forwardly from a vertical wall portion 124 of that track member. A lower section 126 of the flange 119 is disposed forwardly of a front face 128 of the upper head portion. Thus, the upper flange section 122 and the vertical wall portion 124 of the upper track member form an upwardly open track slot 130 which receives the lower edge of a decorative panel 101 which constitutes one of the afore-mentioned panels 20–34. The lower flange section 126, together with the front surface 128, define a downwardly open track slot which receives the upper edge of another decorative front panel 101A.

The lower head portion 104 includes a horizontal rim section 134 and an L-shaped slot 133 disposed therebelow in which an L-shaped rib 135 of a lower track member 136 is mounted. A flange section of the lower track member includes an upper portion 140 disposed forwardly of an arm 142 of the lower head portion to define a track slot therewith which receives the lower edge of the decorative front panel 101A. The flange further includes a lower portion 144 disposed forwardly of a surface 146 of the lower head portion 104 to define a track slot which receives the upper edge of a decorative panel 101B.

It will be appreciated that the front edges of the side decorative panels 100 and the end edges of the front decorative panels 101, 101A, 101B are retained in track slots defined at least in part by the front track members 80 (FIG. 7), i.e., the outer leg 87 and leading flange 98 of each front track member 80 form track slots for the side and front panels 100, 101. Accordingly, by merely unscrewing the screws 86 and removing a front track member 80 at either side of the unit, the associated side panel 100 may be removed as well as all of the front panels (by sliding the latter panels sideways within their respective slots).

The web portions 48 of the side elements 42 include cut-outs 150 (FIG. 6) enabling additional outlets to be installed at a future time, if needed. Such cut-outs are also useful in the event that heat build-up becomes a concern (e.g., if high heat generating equipment such as transformers are disposed within the headwall unit), because the cut-outs facilitate heat dissipation. Such heat dissipation is further facilitated by a vertical heat conducting path 152 (FIG. 3) formed between the web 48 and the associated side panel 100.

The web portions 106 of the front elements 44 are at least partially punched-out, usually over a substantial part of their area, in order to render accessible the interior of the wall unit when the front panels have been removed.

Horizontal plates 160 (FIG. 6) are provided which extend partially or entirely from one side element to the other to brace the unit and support electrical and gas conduits 162, 164 which are situated within the wall unit.

A suspension arrangement is provided from which the wall unit is hung. In this regard, the wall unit includes a pair of hanger plates 170 (FIGS. 5, 6) disposed across the backside of the unit at the upper end thereof. Each hanger plate 170 contains a through-hole 172. Mounted on the wall W is a conduit support bracket 174 which includes a vertical flange 176 and a pair of spaced horizontal flanges 178. The latter each contain a plurality of knockouts 180 to which the ends of electrical conduits 181 (run-in from the ceiling) may be mounted. The space 182 between the horizontal flanges 178 is adapted to accommodate gas conduits 184 which are also run-in from the ceiling.

The bracket 174 is attached to the wall W by means of flanged toggle studs 190 (FIG. 5) which extend through cup-shaped washers 192 and have pivoted grippers 191. Portions 194 of the threaded studs of the fasteners remain projecting from the wall and correspond to the location of the apertures 172 in the suspension plates 170. Thus, the hanger plates 170 can be placed onto the studs 194 and secured thereto by means of a nut 196. The unit 10 thus-mounted is situated beneath the horizontal flanges 178 of the support bracket 174 such that the latter form a top for the wall unit. Moreover, the pre-mounted electrical and gas conduits 181, 184 are vertically aligned with corresponding conduits 162, 164 which have been pre-mounted on the wall unit 10. It is thus merely necessary for the installer to interconnect those conduits once the wall unit has been suspended.

It will be appreciated that the mounting bracket can be installed before the headwall unit is received and the electrical conduits 181 brought-down from the ceiling can be attached to the mounting bracket so as to be accurately pre-located in advance of the arrival of the headwall unit. Since the headwall unit is located in a preselected relationship relative to the mounting bracket, it is assured that the conduits 181, 164 will be properly aligned.

A similar arrangement can be provided for the gas conduits 184, instead of running the gas conduits through the space 182 and into the utility space as shown.

It may be desirable to anchor the lower end of the headwall unit to the wall W. This may be done by means of fasteners such as conventional toggle bolts 206 (FIG. 5) which extend through an anchor bracket 208, the latter being secured by bolts to a lowermost horizontal plate 212 extending between the side elements.

It will be appreciated that a headwall unit according to the present invention is subject to convenient installation and can be easily opened-up for needed maintenance. For installation purposes, the support bracket 174 can be mounted on the wall, and the necessary gas line hook-ups made thereat, even before the headwall unit is received. The headwall unit can be pre-fabricated at a factory along with the front and side elements 44, 14, the necessary patient-servicing equipment and gas conduits, and shipped to the installation site. The headwall frame is suspended from the wall by mounting the apertured plates 170 of the frame onto the studs 194 and attaching the nut 196. The flanges 178 of the mounting bracket overlie the framework and serve as a top cover therefor.

Figure 8:
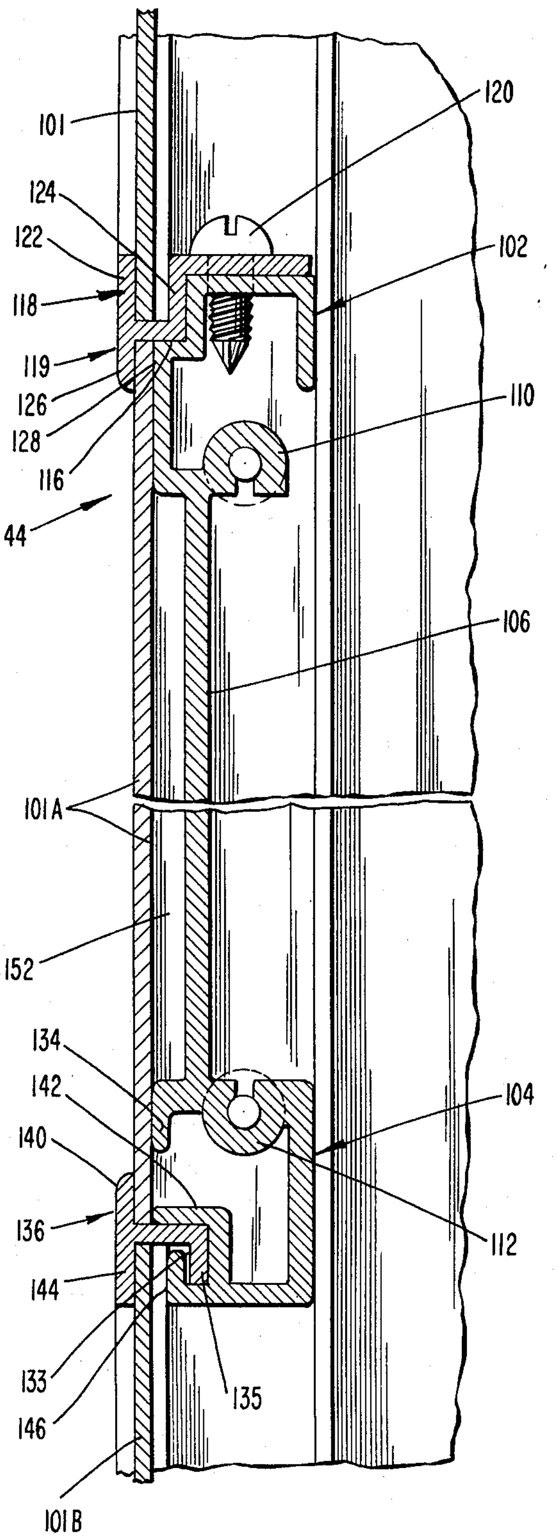
FIG. 8 is a vertical cross-section through a front frame element.

With the front and said panels removed, the necessary gas and electrical hook-ups are made. The prelocated electrical conduits 181 are accurately positioned relative to the conduits 164 carried by the headwall units due to their having been connected to the mounting bracket 174. Then, the front panels are slid in place horizontally along the vertically spaced horizontal track slots formed by the upper and lower track members 118, 136 (FIG. 8). The side panels 100 are inserted into the track slots formed by the rear track members 78. The front track members 80 are installed to retain the front and side panels in place. The panels are thus held in place by the track members 78, 80, 118, 136 and no fasteners such as screws are visible from the front.

Figure 2:
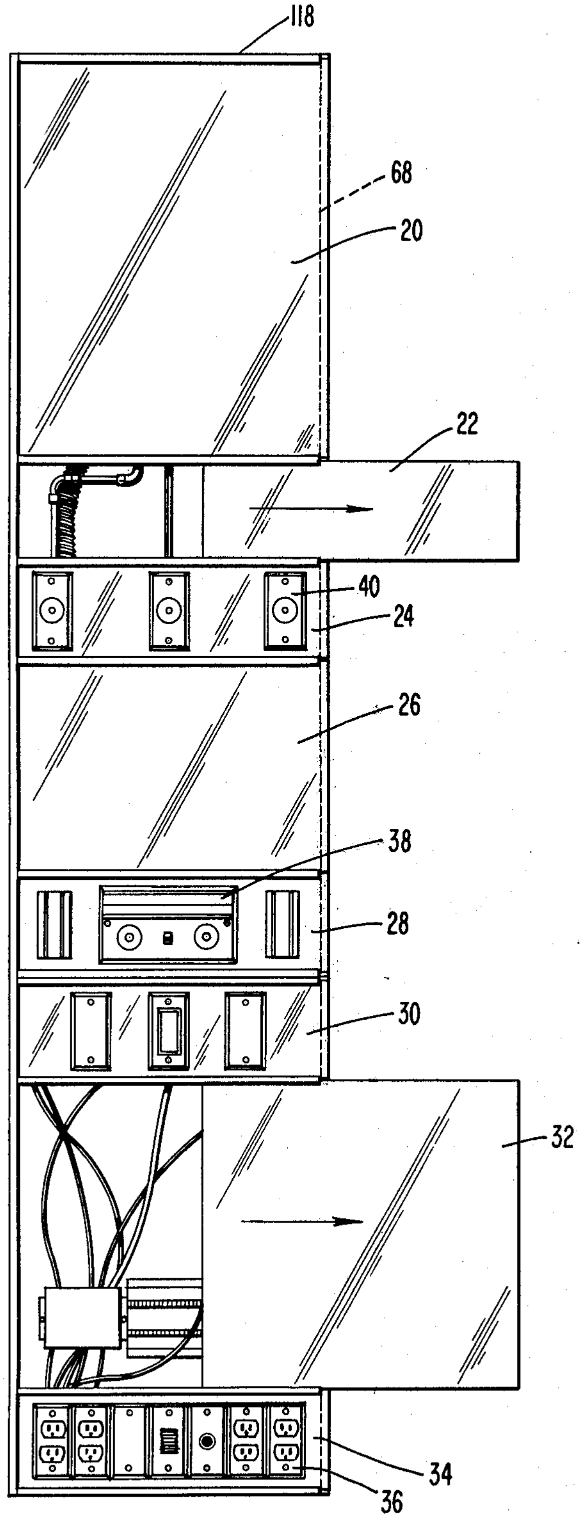
FIG. 2 is a front view of the headwall unit after a vertical track member has been removed and some of the front panels have been partially slid-out.

In the event that it becomes necessary to gain access into the unit, it is merely necessary to remove one of the vertical front track members 80 (FIG. 2), whereupon all of the front panels and the associated side panel can be removed.

Although the invention has been described in connection with a preferred embodiment thereof, it will be appreciated by those skilled in the art that additions, modifications, substitutions, and deletions not specifically described may be made without departing from the spirit and scope of the invention as defined in the appended claims.

What is claimed is:

1. A headwall unit of the type adapted for connection to a wall of a patient's room to provide services to the patient, said headwall unit comprising:

a skeletal framework to which patient service components are connected, said framework having front and side portions and including pairs of vertically spaced horizontal track slots disposed along said front portion, the slots of each pair being open toward one another, front cover panels disposed in said pairs of track slots for horizontal sliding movement therein, said framework including a vertically elongate, releasably attachable means at one side of said unit for preventing removal of said panels from said framework when attached and for accommodating horizontal sliding movement of said panels from said framework when released.

2. A headwall unit according to claim 1, wherein said framework carries medical gas ducts.

3. A headwall unit according to claim 1, wherein said vertically elongate means comprises a vertical track member which overlies one end of each front panel.

4. A headwall unit according to claim 3, wherein said vertical track member extends substantially the entire height of said wall unit.

5. A headwall unit according to claim 3, wherein said framework comprises a pair of vertical side elements and a plurality of horizontal front elements mouunted to said side elements and extending therebetween; each of said side elements forming a first vertical track slot, and said track member forming a second vertical track slot, a vertically elongte side panel retained in said first and second vertical track slots such that release of said track member enables removal of said side panel.

6. A headwall unit according to claim 5, including an additional releasable track member disposed at the other side of said framework such that release thereof enables said front panels to be slid horizontally to that side of said framework and enables removal of the respective side panel.

7. A headwall unit according to claim 5, wherein said track member is secured by screws to said side element, said screws being installed in a direction parallel to the plane of said front panels.

8. A headwall unit according to claim 5, wherein said front elements are secured to said side elements by horizontal screws inserted in a direction parallel to the plane of said front panels.

9. A headwall unit according to claim 1, wherein said framework carries at least one conduit, and further comprising a mounting bracket attachable to the wall and including receiver means for connection to an outside conduit which is to be connected to the first-named conduit, and means for mounting said framework to the wall in preselected locational relationship to said mounting bracket, whereby said receiver means is aligned with said first-named conduit.

10. A headwall unit according to claim 9, wherein said means for connection to an outside conduit comprises at least one horizontal plate which overlies the top of said framework when the latter is installed.

11. A headwall unit according to claim 9, wherein said mounting means comprises fasteners connected to the wall and projecting outwardly therefrom, said mounting bracket and framework being suspended from said fasteners.

12. A headwall unit according to claim 11, wherein said fasteners comprise toggle bolts.

13. A headwall unit according to claim 9, wherein said first named conduit is an electrical conduit.

14. A headwall unit adapted for connection to a wall of a patient's room to provide services to the patient, said headwall unit comprising:

a skeletal framework including vertically extending side elements and horizontally extending front elements interconnecting said side elements, said framework including track-defining means forming track slots receiving front and side panels which cover said front and side elements, said track defining means including means forming upper and lower horizontal front track slots in which said front panels are horizontally slidable, and at least one vertical track member disposed at the intersection of one of said side elements and said front elements, said track member being releasably connected to said framework such that when installed said track member overlies an end of each front panel and when removed said front and side panels can be removed from said framework.

15. A headwall unit according to claim 14, wherein said track member extends substantially the entire height of said wall unit.

16. A headwall unit according to claim 14, wherein each side element includes a vertical rail portion connected to said front elements, a vertical tubular portion, and a vertical web portion interconnecting said rail and tubular portions, said tubular portion forming a vertical track slot.

17. A headwall unit according to claim 14, wherein said framework carries at least one conduit, and further comprising a mounting bracket attachable to the wall and including receiver means for connection to an outside conduit which is to be connected to the first-named conduit, and means for mounting said framework to the wall in preselected locational relationship to said mounting bracket, whereby said receiver means is aligned with said first-named conduit.

* * * * *